United States Patent [19]

Bar-Niv

[11] Patent Number: 5,631,591
[45] Date of Patent: May 20, 1997

[54] METHOD AND APPARATUS FOR SYNCHRONIZING TIMING SIGNALS OF TWO INTEGRATED CIRCUIT CHIPS

[75] Inventor: Amir Bar-Niv, Givatayim, Israel

[73] Assignee: National Semiconductor Corporation, Santa Clara, Calif.

[21] Appl. No.: 449,478

[22] Filed: May 30, 1995

[51] Int. Cl.[6] .................................. H03K 5/13; H03K 5/00
[52] U.S. Cl. ......................... 327/158; 327/12; 327/159; 327/149; 327/244
[58] Field of Search ................................ 327/141, 144, 327/145, 153, 155, 156, 158, 159–163, 99, 233–236, 243–245, 261, 269, 270, 12; 331/49

[56] References Cited

U.S. PATENT DOCUMENTS

| | | | |
|---|---|---|---|
| 4,333,055 | 6/1982 | Crackel | 327/12 |
| 4,546,269 | 10/1985 | Johnson | 327/261 |
| 4,604,582 | 8/1986 | Strenkowski et al. | 327/147 |
| 4,795,985 | 1/1989 | Gailbreath, Jr. | 327/158 |
| 4,922,141 | 5/1990 | Lofgren et al. | 327/158 |
| 5,101,117 | 3/1992 | Johnson et al. | 327/148 |
| 5,122,679 | 6/1992 | Ishii et al. | 327/147 |
| 5,173,617 | 12/1992 | Alsup et al. | 327/295 |
| 5,218,314 | 6/1993 | Efendovich | 328/155 |
| 5,298,866 | 3/1994 | Kaplinsky | 327/261 |

*Primary Examiner*—Timothy P. Callahan
*Assistant Examiner*—T. Lam
*Attorney, Agent, or Firm*—Skjerven, Morrill, MacPherson, Franklin & Friel

[57] ABSTRACT

A phase synchronization circuit uses a phase comparator and adjustable delay lines that selectively delay a system clock timing signal applied to two integrated circuit chips. The phase comparator and delay lines compensate for propagation delays in each of the integrated circuit chip. The phase comparator receives bus clock signals of the two chips and generates two trigger signals for application to two counters. The counters count signals are applied to corresponding delay lines, which are clocked by a system clock. The delayed timing signals from the delay lines furnish timing signals to the corresponding integrated circuit chips. The count of the counter which corresponds to the integrated circuit chip having the smaller propagation delay is increased until the bus clock signals for the two integrated circuit chips are phase synchronized.

26 Claims, 8 Drawing Sheets

METHOD AND APPARATUS FOR SYNCHRONIZING TIMING SIGNALS OF TWO INTEGRATED CIRCUIT CHIPS

FIELD OF INVENTION

This invention relates to the field of phase synchronization circuits. More specifically, this invention describes a phase synchronization circuit using a phase comparator for detecting phase differences between two timing signals and delay lines to compensate for the phase differences.

BACKGROUND OF THE INVENTION

Many electronic circuits include two mutually-interacting integrated circuit chips. The interactions between the integrated circuit chips is such that the timing of the chips must be phase-synchronized. One example of such an electronic circuit is a computer system employing two cooperating central processing units or microprocessors. The separate integrated circuit chips receive timing signals from the same system clock signal. However, due to variations in internal signal propagation delays between the two chips, the bus timing signals within each chip and, therefore, all timing signals based on the bus timing signals, are not phase synchronized. Accordingly, there is a need to synchronize the bus timing signals of the different integrated circuit chips. Timing signals are synchronized when their rising edges match in time.

Conventional electronic circuits typically adjust one clock with another using partial digital and all-digital phased locked loop circuits. These circuits are real-time phase locked loop circuits and, as such, are complicated, requiring external control signals or substantial control circuitry for operation. The complicated nature of phase locked loop implementations greatly increases the costs of the circuits. Other disadvantages are inherent in phase-locked loop designs. For example, phase-locked loops often utilize a voltage-controlled oscillator (VCO) in the feedback path. Various limitations are associated with analog voltage-controlled oscillators. One problem is a highly nonlinear transformation of voltage to frequency by the VCO which results from nonlinear effects in MOS transistors of the VCO.

Furthermore, a conventional phase-locked loop system often uses a loop filter to obtain frequency stability in the feedback loop. The loop filter usually includes two capacitors and a resistor which are external to the integrated circuit. An integrated circuit normally produces some internal digital switching noise which induces noise signals on VDD and VSS power supply lines. Because the ground reference potential internal to the integrated circuit includes some noise, the ground potential internal to the integrated circuit has a different potential than the ground reference external to the integrated circuit. This voltage difference between the ground potential internal to the integrated circuit and the ground potential of the loop filter components outside the integrated circuit unavoidably introduces some noise, called phase jitter, on the output of the phase-locked loop.

In many applications, performance degradation arising from phase jitter and nonlinear behavior of the voltage-controlled oscillator is too great to overcome using a phase-locked loop circuit. Therefore a new approach is sought.

SUMMARY OF THE INVENTION

In accordance with an embodiment of the present invention, a phase synchronization circuit uses a phase comparator and adjustable delay lines that selectively delay a system clock timing signal applied to two integrated circuit chips. The phase comparator and delay lines compensate for propagation delays in each of the integrated circuit chip. The phase comparator receives bus clock signals of the two chips and generates two trigger signals for application to two counters. The counters count signals are applied to corresponding delay lines, which are clocked by a system clock. The delayed timing signals from the delay lines furnish timing signals to the corresponding integrated circuit chips. The count of the counter which corresponds to the integrated circuit chip having the smaller propagation delay is increased until the bus clock signals for the two integrated circuit chips are phase synchronized.

In accordance with another embodiment of the present invention, a phase synchronization circuit for synchronizing timing of first and second integrated circuit chips includes a phase comparator connected to the first integrated circuit chips for receiving a first bus timing signal and connected to the second integrated circuit chip for receiving a second bus timing signal. The phase comparator generates a signal which is indicative of a propagation delay of the first and second bus timing signals. The phase synchronization circuit also includes first and second adjustable delay lines which are connected to the phase comparator for receiving the signal indicative of the propagation delay and connected to a system clock line for receiving a system clock signal. The first and second adjustable delay lines respectively generate a first source clock signal for timing the first integrated circuit chip and a second source clock signal for timing the second integrated circuit chip. The first and second delay lines respond to the signal indicative of the propagation delay by increasing a delay of the source clock signal of the first and second source clock signals which corresponds to a bus timing signal of the first and second bus clock signals having a smaller propagation delay.

In accordance with an additional embodiment of the present invention, a phase synchronization circuit includes a phase comparator, a delay circuit and a frequency switch. The phase comparator includes a phase lock detect circuit and has a first input terminal connected to a first bus clock line, a second input terminal connected to a second bus clock line, a first output terminal connected to a first trigger line, a second output terminal connected to a second trigger line, a control input terminal connected to a dear line and a control output terminal connected to a phase lock line. The delay circuit has a first input terminal connected to the first trigger line, a second input terminal connected to the second trigger line, a first output terminal connected to a first source clock line, a second output terminal connected to a second source clock line, a clock input terminal connected to a clock line, a control input terminal connected to a reset line and a control output terminal connected to the clear line. The frequency switch has a clock signal input terminal connected to a system oscillator, a clock signal output terminal connected to the clock line and a control input terminal connected to the phase lock line.

In accordance with another embodiment of the present invention, a method of synchronizing timing signals of two integrated circuits includes the steps of detecting a system reset signal and enabling a low frequency temporary oscillator and disabling a system oscillator upon such detection. The method further includes the steps of sensing a rising edge of a first bus clock signal and a second bus clock signal, comparing a relative phase difference between the first and second bus clock signals to determine whether the relative phase difference between the first and second bus clock signals is greater than 180°. If the relative phase difference between the first and second bus clock signals is greater than 180°, the first and second bus clock signals are rough synchronized by eliminating one source clock cycle from the second bus clock signal. Following rough synchronization, the method includes fine synchronization which includes the steps of identifying the leading bus clock signal to be a preempted bus clock signal and detecting rising edges of a plurality of preempted bus clock signals. For each rising edge of the plurality of preempted bus clock signal, a counter is incremented. The count in the counter is used to set an adjustable delay line of the source clock timing signal which corresponds to the preempted bus clock signal. Fine synchronization further includes the steps of comparing a relative phase of the first and second bus clock signals and terminating further delaying of the source clock timing signal when the relative phase of the first and second bus clock signals match. Phases of the bus clock signals are then locked by locking of the phase comparator. A final step is switching of the system clock from the low frequency clock oscillator to the system oscillator, smoothly and without jitter.

Use of the phase comparator and delay lines to synchronize timing signals to two integrated circuit chips as described above has several advantages. One advantage is that the described method and apparatus is "hardware independent" so that synchronization is achieved for various different types of integrated circuit chips. The phrase "hardware independent" means that the described apparatus and method does not require external control signals for determining the direction of the internal phase inside the chip. A further advantage is the simplicity of the described circuit which includes a small number of low-cost components rather than programmable state-machines or external control processing. An additional advantage of the described synchronization apparatus and method is that synchronization is achieved for an extensive range of system clock frequencies so that the apparatus and method is "frequency independent". Frequency independence is accomplished due to the tracking process which uses a slow fixed clock and the frequency-independent technique of delay compensation.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION

Figure 1:
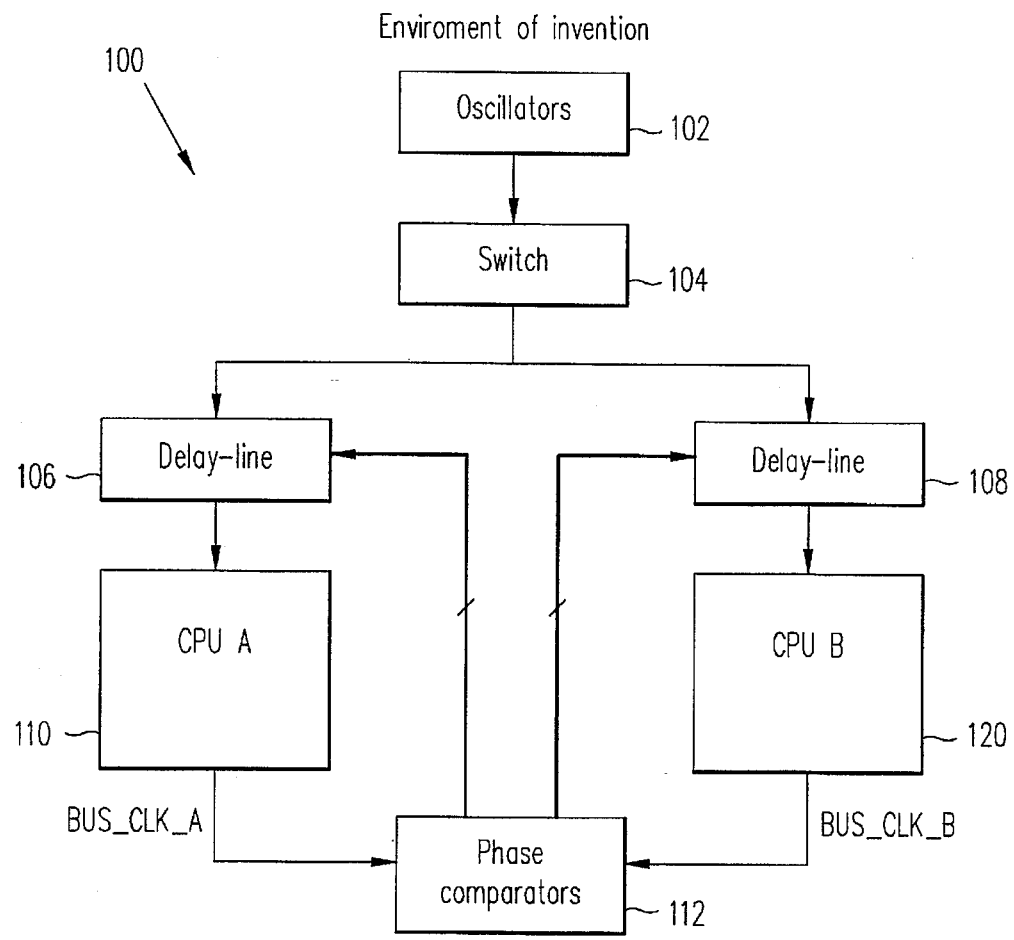
FIG. 1 illustrates a schematic block diagram of a computer system indicative of the general environment in which a phase synchronization circuit of the present invention is implemented.

Referring to FIG. 1, a computer system 100 includes two central processing units, CPU A 110 and CPU B 120. For proper performance of the computer system 100, bus clock signals of the circuits CPU A 110 and CPU B 120 are mutually synchronized. Source clock timing signals applied to the circuits CPU A 110 and CPU B 120 originate from the same system clock signal in oscillators block 102. However, due to variations in propagation delays internal to the CPU A 110 and CPU B 120 circuits, bus clock signals on bus clock lines BUS_CLK_A and BUS_CLK_B respectively, are not typically synchronized in the absence of circuit that provide synchronization. In computer system 100, frequency switch circuit 104, first and second delay line circuits 106 and 108, and phase comparator circuit 112 supply synchronization of the clock signals.

Figure 2:
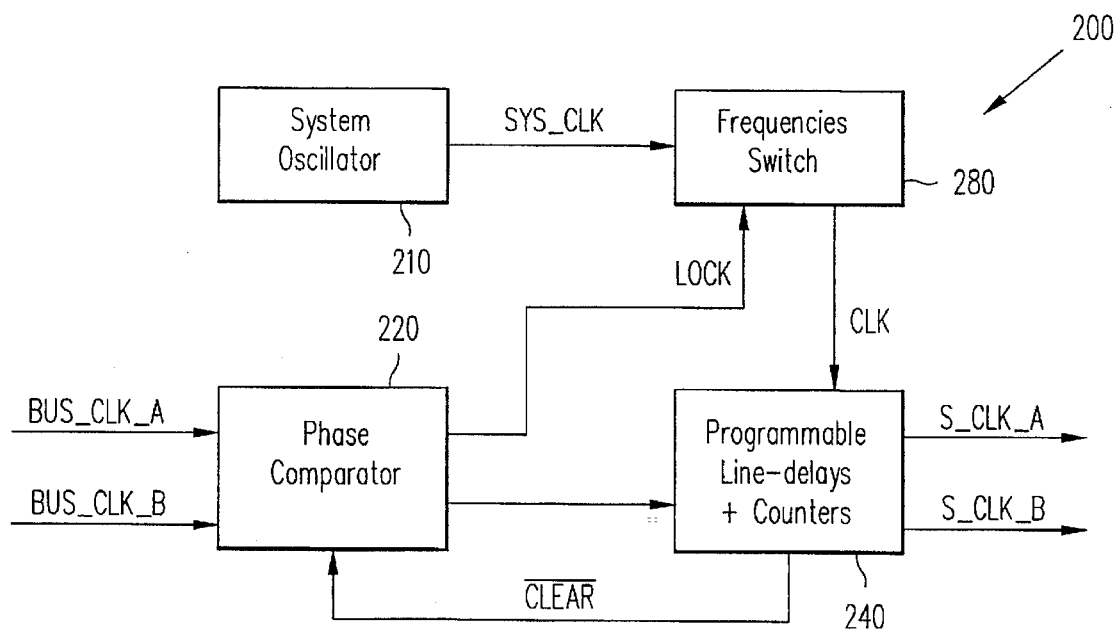
FIG. 2 depicts a schematic block diagram of an embodiment of a phase synchronization circuit in accordance with the present invention.

Referring to FIG. 2, a phase synchronization circuit 200 contains various functional circuit blocks including a system oscillator 210, a phase comparator circuit 220, a delay and counter circuit 240 and a frequency switch 280. These circuit blocks are interconnected by various lines that carry timing signals. The BUS_CLK_A and BUS_CLK_B lines carry bus clock signals from integrated circuit chips (for example, CPU A 110 and CPU B 120 shown in FIG. 1). Lines S_CLK_A or S_CLK_B carry source clock signals to the integrated circuit chips. A system clock signal is generated by the frequency switch 280 and communicated to the delay and counter circuit 240 on a CLK line.

Figure 3:
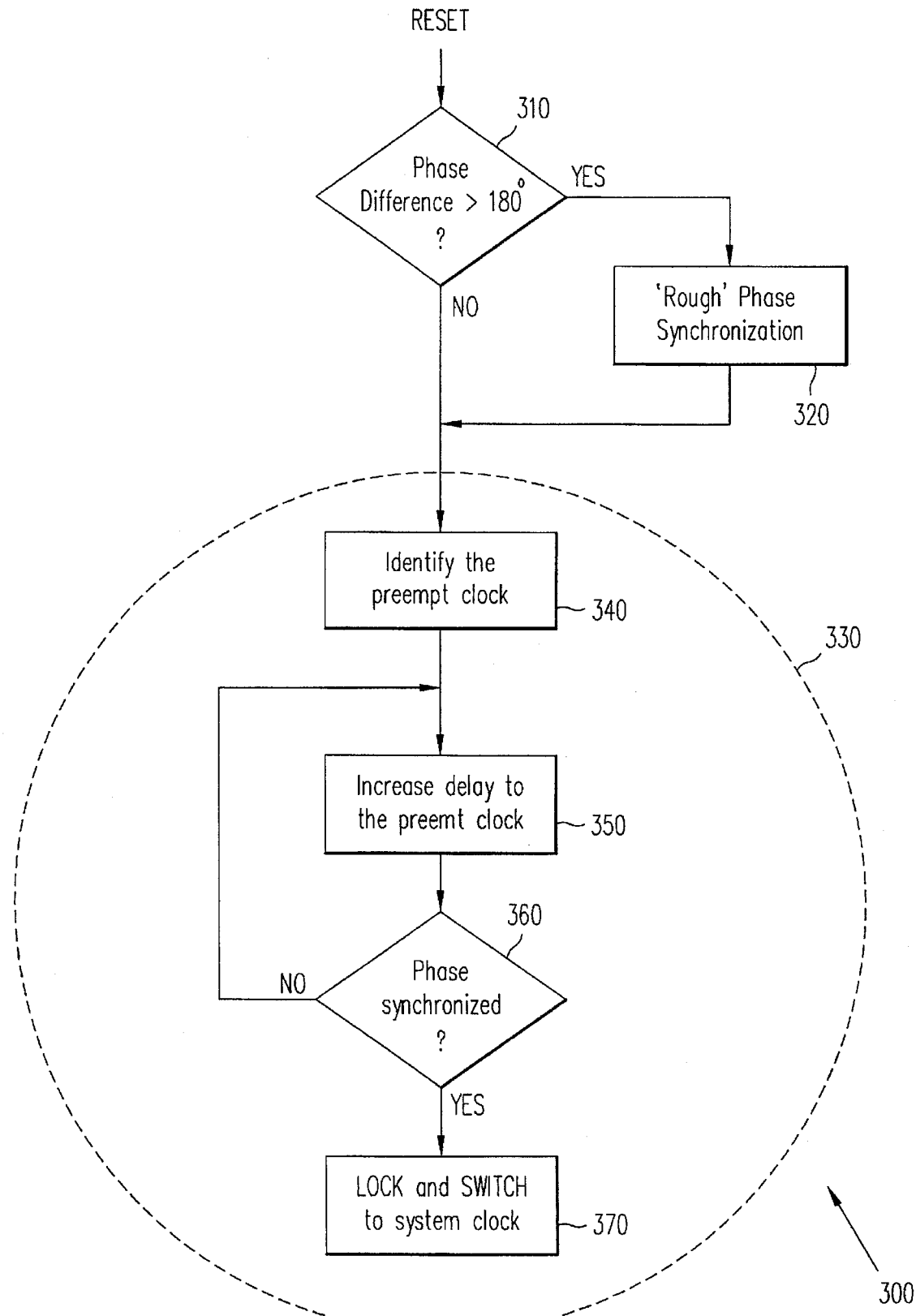
FIG. 3 shows a flow chart which is illustrative of a method of phase synchronization in accordance with an embodiment of the present invention.

Referring to the flow chart shown in FIG. 3 in conjunction with the block diagram of the phase synchronization circuit 200 shown in FIG. 2, a power-up or reset condition originates a tracking process for which timing signals are supplied by a relatively low-frequency oscillator 290 (see FIG. 6) in the frequency switch circuit 280. The purpose of the tracking process is to detect the phase skew between the bus clock signals on BUS_CLK_A and BUS_CLK_B lines. The timing signals on the BUS_CLK_A and BUS_CLK_B lines oscillate at half the frequency of the system clock signal on the CLK line. To provide for a system which does not include an external control element for synchronizing the phase of internal clock signals, the phase synchronization process 300 has two synchronization phases, a rough synchronization phase 320 and a fine synchronization phase 330. The rough synchronization phase 320 is activated when the phase difference between the first and second bus clock signals on BUS_CLK_A and BUS_CLK_B lines is greater than 180°, as determined by a phase difference logic step 310. The phase difference between bus clock signals is greater than 180° when one of the bus clock signals is a high level and the other is a low level. In the phase difference logic step 310, the delay and counter circuit 240 detects the 180° phase difference condition. In the rough synchronization phase 320, delay and counter circuit 240 synchronizes the phases so that both bus clock signals will change from LOW to HIGH simultaneously on the same rising edge of the clock. Rough synchronization is achieved by eliminating one cycle of either of the source clock signals on lines S_CLK_A or S_CLK_B. The rough synchronization phase 320 advantageously enables the usage of line delay circuit elements which have a smaller dynamic range because the need for compensating for delays that are greater than half the cycle period is eliminated.

The fine synchronization phase 330 begins fine tuning of the bus clock signal phases by identifying the preempted clock in step 340. In identify preempted clock step 340, the phase comparator circuit 220 detects the first rising edge of each bus clock signal to determine which is the preempted bus clock signal. Of the two bus clock signals on lines BUS_CLK_A and BUS_CLK_B the phase leading signal is the preempted signal. On every subsequent rising edge of the preempted bus clock signal, in increase delay to the preempt clock step 350, the phase comparator circuit 220 sends a trigger signal to a counter in delay and counter circuit 240 which delays the source clock to the preempted bus clock signal. This counter controls the delay line for delaying the source clock of the preempted bus clock signal. The counter is triggered to increment the counts of the counter and a delay interval is added to the source clock for each count until the phases are matched. Then, when the phases are matched, a locked condition is detected by the phase comparator circuit 220 in a phase synchronized logic step 360. This locked condition, detected and signalled by the phase comparator circuit 220 initiates the lock and switch to system clock step 370. In the lock and switch to system clock step 370, the frequency switch circuit 280 smoothly switches the clock signal on CLK line to the system clock on SYS_CLK line.

Figure 4:
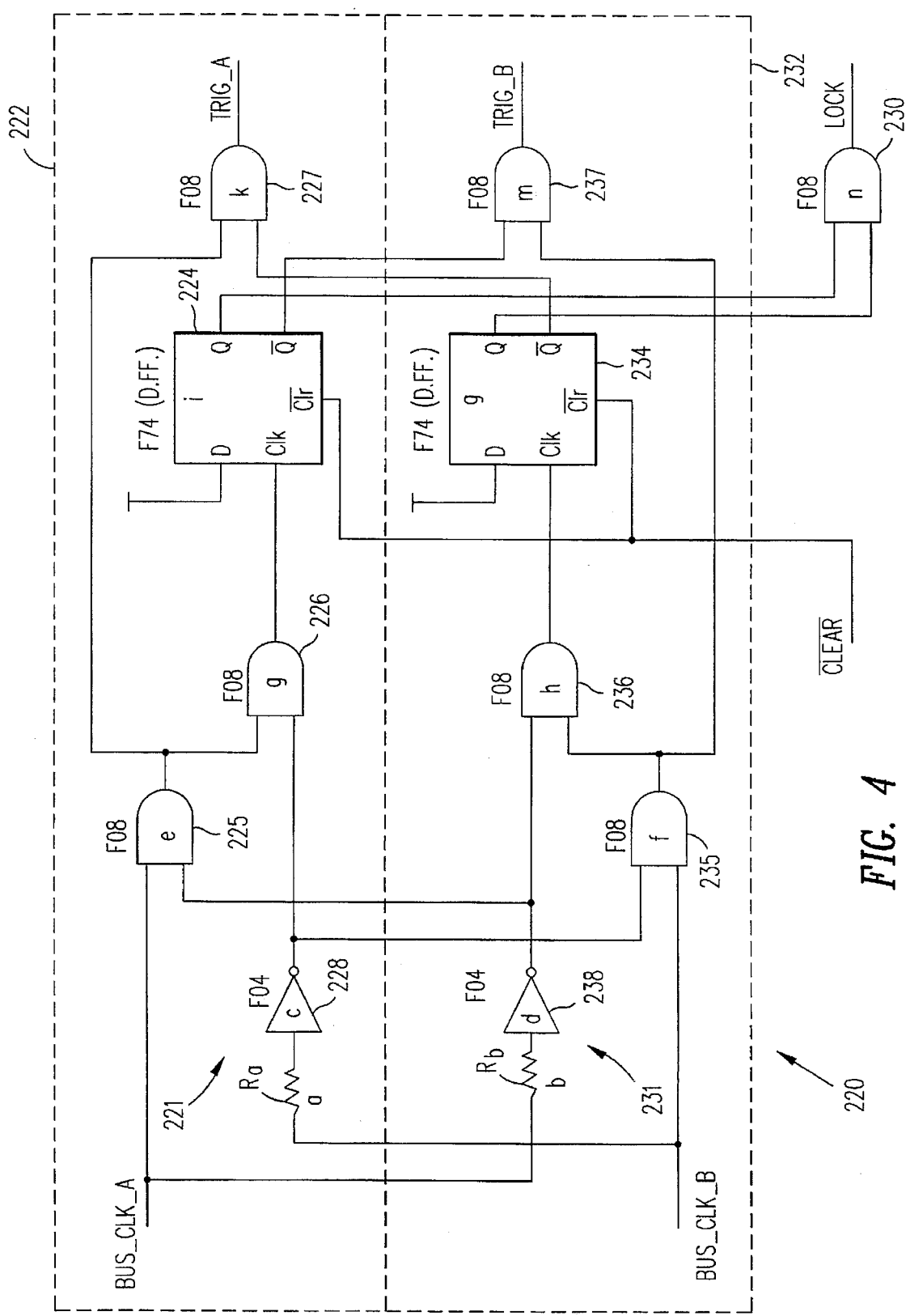
FIG. 4 illustrates a schematic circuit diagram of a phase comparator circuit included in the circuit shown in FIG. 2.

Referring to FIG. 4, the phase comparator circuit 220 includes a first clock line phase comparator circuit 222 and a second clock line phase comparator circuit 232. The first and second clock line phase comparator circuits 222 and 232 are mutually symmetric circuits. The first clock line phase comparator circuit 222 includes a first D flip-flop 224, AND gates 225, 226 and 227, an inverter 228 and a resistor Ra. The first D flip-flop 224 has a D input terminal connected to a VDD voltage source terminal, a clock input terminal connected to an output terminal of AND gate 226, a Q output terminal connected to an input terminal of a lock AND gate 230 and a $\overline{Q}$ output terminal connected to an input terminal of an AND gate 237 of the second clock line phase comparator circuit 232. AND gate 226 has one input terminal connected to the output terminal of AND gate 225 and another input terminal connected to the output terminal of inverter 228. AND gate 225 has a first input terminal connected to a BUS_CLK_A line, receiving a first bus clock signal, and a second input terminal which receives a delayed and inverted version of the first bus clock signal. Delay of the first bus clock signal is achieved by connecting the BUS_CLK_A line to series connection of a resistor Rb and an inverter 238 of the second clock line phase comparator circuit 232. The output terminal of inverter 238 is connected to the second input terminal of AND gate 225. AND gate 227 has an input terminal connected to the output terminal of AND gate 225, an input terminal connected to the $\overline{Q}$ output terminal of a second D flip-flop 234 of the second clock line phase comparator circuit 232.

The second clock line phase comparator circuit 232 is substantially the same in structure as the first clock line phase comparator circuit 222 and includes a second D flip-flop 234, as well as AND gates 235, 236 and 237, an inverter 238 and a resistor Rb which respectively correspond to AND gates 225, 226 and 227, an inverter 228 and a resistor Ra.

Phase comparator circuit 220 receives first and second bus clock signals on BUS_CLK_A and BUS_CLK_B lines, respectively, and generates respective first and second trigger signals on corresponding TRIG_A and TRIG_B lines. The first and second trigger signals are connected to corresponding first and second counters in the delay and counter circuit 240.

Resistor Rb, inverter 238 and AND gate 225 form a differentiator circuit 221 for the first bus clock signal on BUS_CLK_A line. The differentiator circuit 221 renders the phase comparator circuit 220 unresponsive to signals other than signals in the form of a rising edge. Accordingly, the differentiator circuit 221 advantageously make the phase comparator circuit 220 independent of the duty-cycle of various clock signals. The output signal of differentiator circuit 221, furnished by AND gate 225, drives the output trigger signal on TRIG_A line via AND gate 227 and also sends a clocking signal to the clock input terminal of D flip-flop 224 via AND gate 226.

Similar to differentiator circuit 221, a differentiator circuit 231 includes resistor Ra, inverter 228 and AND gate 235 which act on the second bus clock signal on BUS_CLK_B line.

The inverter and AND gate components of differentiator circuits 221 and 231 are selected from FAST family components which have a small propagation delay and therefore a small range between the maximum MAX and minimum MIN delays. Accordingly, circuit accuracy is improved. Resistors Ra and Rb add extra delay to the response of inverters 228 and 238, respectively, also improving the accuracy of the phase comparator circuit 220.

Figure 5:
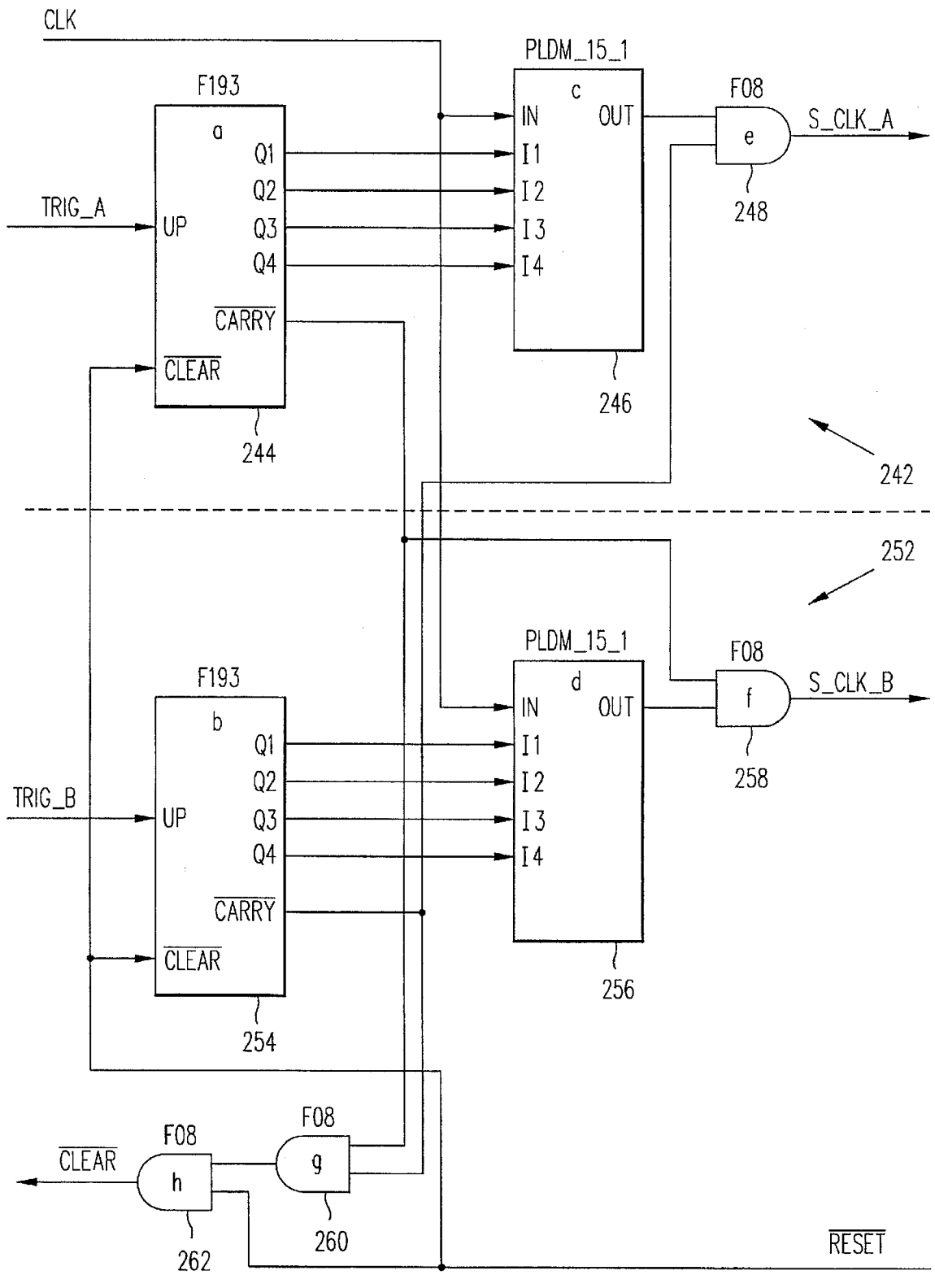
FIG. 5 shows a schematic circuit diagram of a delay and counter circuit included in the circuit shown in FIG. 2.

Referring to FIG. 5, the delay and counter circuit 240 includes a first clock line delay and counter circuit 242 and a second clock line delay and counter circuit 252. The first and second clock line delay and counter circuits 242 and 252 are mutually symmetric circuits. The first clock line delay and counter circuit 242 has an input terminal connected to receive a first trigger signal on TRIG_A line, a clock signal input terminal connected to the CLK line, an active-low reset input terminal connected to a $\overline{RESET}$ line, and an output terminal connected to a first source clock line S_CLK_A for supplying a first synchronized clock signal. The first clock line delay and counter circuit 242 also connected to a first carry line, supplying an active-low first carry signal. The first clock line delay and counter circuit 242 includes a counter 244, a delay circuit 246 and an AND gate 248. The counter 244 has an input terminal connected to the TRIG_A line to receive the first trigger signal. With each count of the first trigger signal, the counter 244 increments a count by one and communicates the count to the delay circuit 246 via four output terminals Q1, Q2, Q3 and Q4 which are respectively connected to four input terminals of the delay circuit 246, terminals I1, I2, I3 and I4. When the count exceeds 15, the active-low carry signal changes from a nonasserted to an asserted state. When a system reset signal is asserted and communicated to the counter 244 via the $\overline{RESET}$ line, the count of counter 244 is set to a value of zero. Delay circuit 246 receives the count signal from counter 244 on terminals I1, I2, I3 and I4, and receives the clock signal on CLK line to generate a delayed synchronized clock signal which is applied to a first input terminal of AND gate 248 and then to S_CLK_A line, when enabled by a signal from the second delay and counter circuit 252. The synchronized clock signal on S_CLK_A line is substantially similar to the clock signal on CLK line except that the synchronized clock signal is delayed, for example by 1 ns per count of the count signal from counter 244.

The second clock line delay and counter circuit 252 is substantially the same, in structure and function, as first clock line delay and counter circuit 242 and includes a counter 254, a delay circuit 256 and an AND gate 258. The second clock line delay and counter circuit 252 has an input terminal connected to receive the second trigger signal on the second output terminal TRIG_B, a clock signal input terminal connected to the CLK line, an active-low reset input terminal connected to a $\overline{\text{RESET}}$ line, and an output terminal connected to a second source clock line S_CLK_B for supplying a second synchronized clock signal.

The clock signals on clock lines S_CLK_A and S_CLK_B are respectively synchronized by the first and second clock line delay and counter circuits 242 and 252 through interconnections between the active-low carry signal lines of counters 244 and 254. The active-low carry signal output line of counter 244 in the first clock line delay and counter circuit 242 is connected to an input terminal of AND gate 258 of the second clock line delay and counter circuit 252. Likewise, the active-low carry signal output line of counter 254 in the second clock line delay and counter circuit 252 is connected to an input terminal of AND gate 248 of the first clock line delay and counter circuit 242. Accordingly, the source clock signal on the S_CLK_A line is disabled by the carry signal from the second clock line delay and counter circuit 252 when the count of counter 254 carries. The source clock signal on the S_CLK_B line is disabled by the carry signal from the first clock line delay and counter circuit 242 when the count of counter 244 carries.

The active-low carry signals from counters 244 and 254 are each applied to an input terminal of an AND gate 260 and the resulting logic signal is applied to an input terminal of an AND gate 262. A second input terminal of AND gate 262 receives a system reset signal on an external $\overline{\text{RESET}}$ line so that AND gate 262 furnishes an active-low clear signal on $\overline{\text{CLEAR}}$ line. The active-low clear signal on $\overline{\text{CLEAR}}$ line passes the system reset signal and also is asserted when the count of either counter 244 or counter 254 carries.

Figure 6:
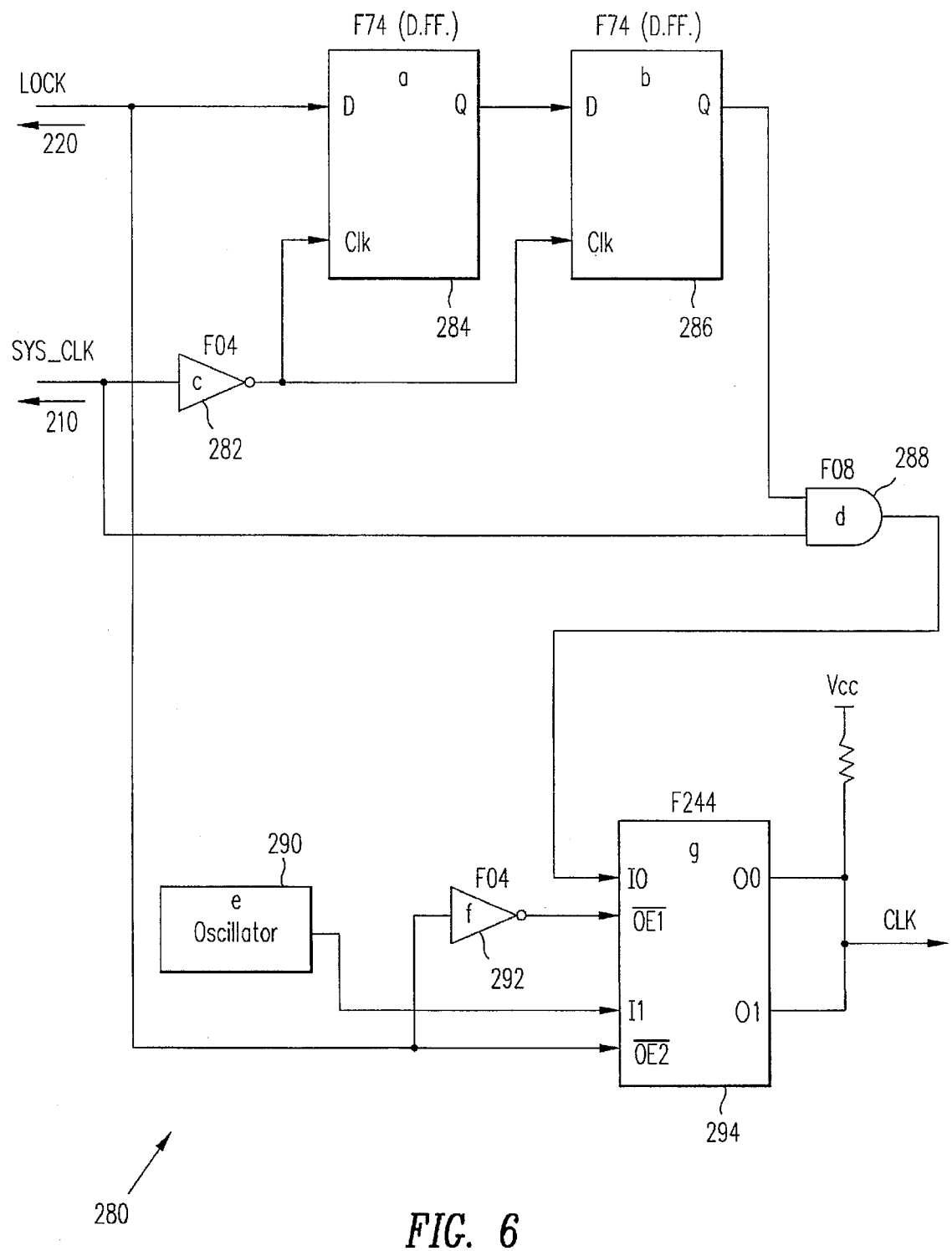
FIG. 6 illustrates a schematic circuit diagram of a frequency switch circuit included in the circuit shown in FIG. 2.

Referring to FIG. 6, the frequency switch 280 includes an inverter 282 and first and second D flip-flops 284 and 286. Inverter 282 has an input terminal connected to the system oscillator 210 for receiving the system clock signal on line SYS_CLK. First D flip-flop 284 has a D input terminal which is connected to the phase comparator circuit 220 to receive the lock signal on a LOCK line and a clock terminal connected to an output terminal of inverter 282 so that first D flip-flop 284 is clocked on the falling edge of the system clock signal on line SYS_CLK. First D flip-flop 284 has a Q output terminal which passes the lock signal after a delay of one falling edge of the system clock signal on line SYS_CLK. Second D flip-flop 286 has a D input terminal which is connected to the Q output terminal of the first D flip-flop 284 and a clock terminal connected to an output terminal of inverter 282 so that second D flip-flop 286 is also clocked on the falling edge of the system clock signal on line SYS_CLK. Second D flip-flop 286 has a Q output terminal which passes the lock signal after a delay of two falling edges of the system clock signal on line SYS_CLK. An AND gate 288 has a first input terminal connected to the Q output terminal of the second D flip-flop 286 and a second input terminal connected to the system oscillator 210 for receiving the system clock signal on line SYS_CLK. Thus, the AND gate 288 has an output terminal which generates a timing signal which follows the system clock signal so long as the lock signal, delayed by two system clock falling edges, is asserted.

The frequency switch 280 also includes an oscillator 290, an inverter 292 and a buffer/line driver circuit 294. The oscillator 290 oscillates at a relatively low frequency in comparison to the system oscillator 210 and furnishes a clock signal for driving the phase synchronization circuit 200 during the synchronization process until the first and second bus clock signals on BUS_CLK_A and BUS_CLK_B lines are synchronous. The buffer/line driver circuit 294 has a first data input terminal connected to the output terminal of the AND gate 288, a first noninverting output terminal supplying a buffered signal from the first data input terminal, and a first active-low output enable terminal for enabling the output signal on the first noninverting output terminal. The inverter 292 has an input terminal connected to the delay and counter circuit 240 and receives the lock signal on LOCK line from phase comparator circuit 220. The first active-low output enable terminal of the buffer/line driver circuit 294 is connected to the output terminal of the inverter 292 for receiving the inverted lock signal. The first noninverting output terminal of the buffer/line driver circuit 294 is connected to the CLK line to supply the clock signal to the delay and counter circuit 240. The buffer/line driver circuit 294 has a second data input terminal connected to an output terminal of the oscillator 290, a second noninverting output terminal supplying a buffered signal from the second data input terminal, and a second active-low output enable terminal for enabling the output signal on the second noninverting output terminal. The second active-low output enable terminal of the buffer/line driver circuit 294 is connected to the phase comparator circuit 220 to receive the lock signal on LOCK line. The second noninverting output terminal of the buffer/line driver circuit 294 is also connected to the CLK line to supply the clock signal to the delay and counter circuit 240. A pullup resistor $R_{fs}$ is connected between a VCC voltage source terminal and a node connecting the first and second noninverting output terminals of buffer/line driver circuit 294. Thus, the buffer/line driver circuit 294 supplies a clock signal on CLK line which is furnished by the oscillator 290 when the lock signal is not asserted and furnished by the system oscillator 210 two system clock falling edges following an asserted lock signal.

With respect to the operation of the phase synchronization circuit 200, the frequency switch 280 receives the system clock signal on line SYS_CLK, the lock signal on LOCK line and generates the clock signal on CLK line. Phase comparator circuit 220 reaches a condition of phase synchrony and asserts the lock signal. The lock signal activates the switching operation of the frequency switch 280, changing the origin of the clock signal on CLK line from the oscillator 290 internal to the frequency switch 280 to the system oscillator 210 after a delay of two falling edges of the system clock signal on the line SYS_CLK. This oscillator switching is delayed so that the timing change is smooth with substantially no jitter. Smooth clock switching is advantageous because, without smooth switching, jitter causes electrical signal spikes which can be sensed or not sensed by various circuits in a system. For example, in a system utilizing two processors, a first CPU may sense an electrical signal spike and a second CPU may not sense the spike, causing a loss of phase synchronization (by 180°) between the processors. Thus, the frequency switch 280 advantageously smooths the change in timing signals by synchronizing the lock signal on LOCK line to the system clock signal on the SYS_CLK line.

The phase synchronization circuit 200 uses the phase comparator circuit 220 and adjustable delay lines of the delay and counter circuit 240, which delays a clock signal on CLK line to the two integrated circuit chips (for example, CPU A 110 and CPU B 120 shown in FIG. 1), to compensate for internal propagation delays on the bus clock lines BUS_CLK_A and BUS_CLK_B. The phase comparator circuit 220 receives the bus clock signals of the two chips on the bus clock lines BUS_CLK_A and BUS_CLK_B and generates trigger signals on trigger signal lines TRIG_A and TRIG_B for two counters 244 and 254 in the delay and counter circuit 240. Digital count signals from the counters 244 and 254 are applied as programmed line delay control signals to delay circuits 246 and 256, respectively. The delay circuits 246 and 256 receive the system clock signal on CLK line and generate source clock signals on lines S_CLK_A and S_CLK_B from the system clock signal based on the programming. Lines S_CLK_A and S_CLK_B are connected to the two integrated circuit chips (for example, CPU A 110 and CPU B 120), respectively, to supply timing signals. The counter 244 or 254 is incremented so that an extra delay is added to the source clock signal of the integrated circuit chip having the smaller propagation delay until the bus clock signals are phase synchronized.

Figure 7:
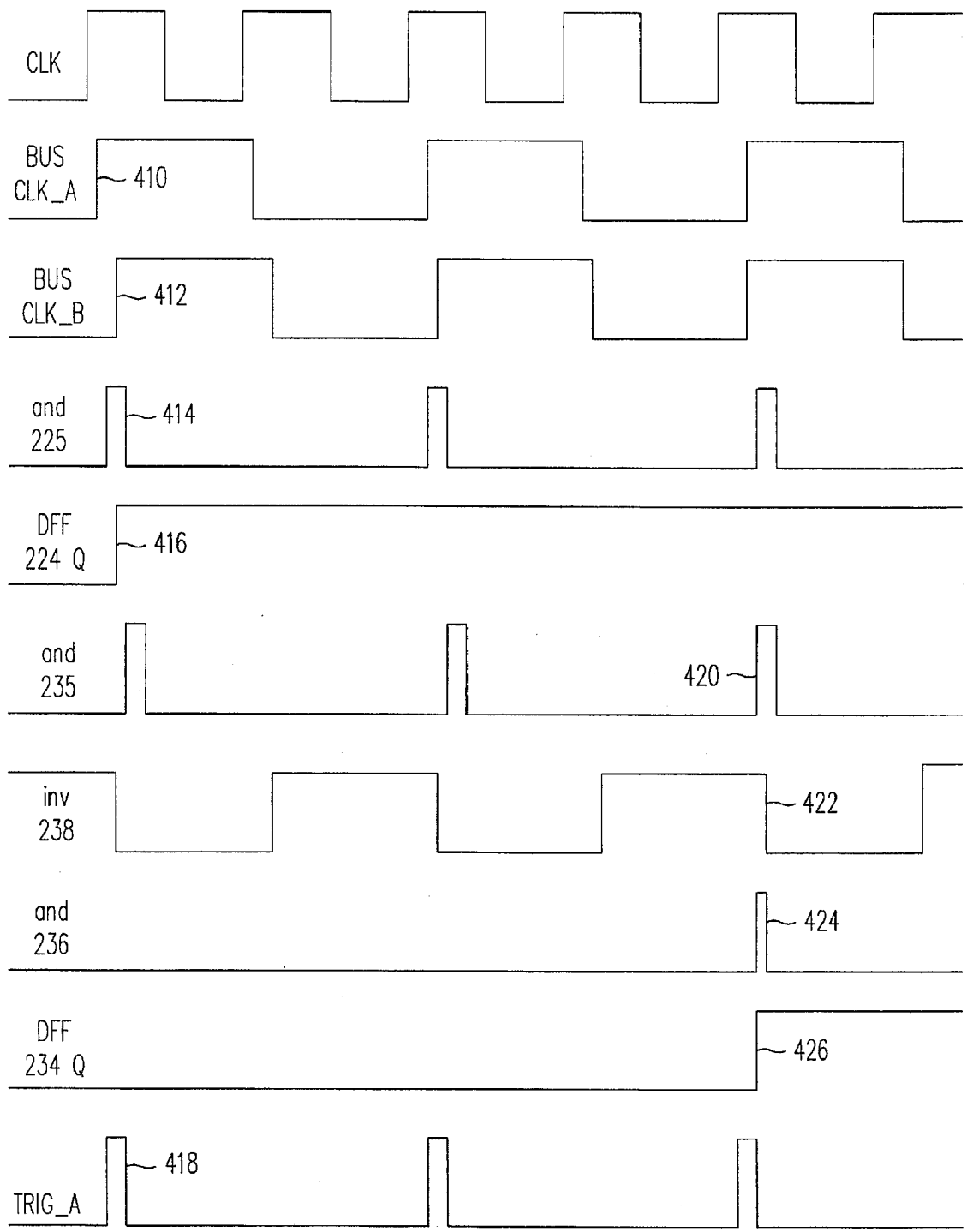
FIG. 7 depicts a timing diagram which illustrates the operation of the phase comparator circuit shown in FIG. 4.

Referring to FIG. 7 in conjunction with FIGS. 1 through 6, a timing diagram illustrates the operation of phase comparator circuit 220. A rising edge 410 of the first bus clock signal on BUS_CLK_A line preempts a rising edge 412 of the second bus clock signal on BUS_CLK_B line. The rising edge of the first bus clock signal (BUS_CLK_A) generates a short pulse 414 at the output terminal of AND gate 225 and inhibits generation of a pulse at the output terminal of AND gate 236 via inverter 238. Second bus clock signal on BUS_CLK_B line remains low and is applied to inverter 228, which passes a high level at its output terminal, as the pulse from AND gate 225 is applied as a trigger signal to the clock terminal of D flip-flop 224. D flip-flop 224 responds to the trigger signal by changing the voltage on the $\overline{Q}$ output terminal (shown with respect to a rising edge 416 of the D flip-flop Q terminal) from a high level to a low level, causing the second trigger signal on TRIG_B line to remain low until the phase comparator circuit 220 reaches a "lock" state.

The pulse from AND gate 225 also triggers the first trigger signal 418 on TRIG_A line which increments the first clock line counter 244 of the delay and counter circuit 240. The high level of the first bus clock signal on BUS_CLK_A line is inverted by inverter 238 to hold the output signal of AND gate 236 to a low level, inhibiting clocking of D flip-flop 234. The first bus clock signal on BUS_CLK_A line continues to oscillate and, until the phase comparator circuit 220 reaches the lock state, each rising edge of the first bus clock signal increments the first clock line counter 244. The count of the first clock line counter 244 controls a line-delay that adds a delay interval to the timing of the first bus clock signal on BUS_CLK_A line.

The phase comparator circuit 220 reaches the lock state when the rising edge 420 of the first bus clock signal on BUS_CLK_A line is sufficiently close to the rising edge 422 of the second bus clock signal on BUS_CLK_B line that the pulse at the output terminal of AND gate 235 is generated before the signal at the output terminal of inverter 238 goes low so that AND gate 236 is not inhibited and generates a pulse 424 and D flip-flop 234 is clocked 426. The clocking of D flip-flop 234 generates a low level signal at the $\overline{Q}$ output terminal of D flip-flop 234 which inhibits AND gate 227, holding the first trigger signal on TRIG_A line to a low level. Accordingly, the counters and delay lines in the delay and counter circuit 240 are held fixed. In this condition, the Q output terminal of both D flip-flops 224 and 234 generates a high level signal, each of which is applied to an input terminal of lock AND gate 230 to generate a high level lock signal on a LOCK line. The activated lock signal is applied to trigger the frequency switch 280.

Timing accuracy of the phase comparator circuit 220 is determined by the maximum time interval between the rising edges of the first and second bus clock signals on BUS_CLK_A and BUS_CLK_B lines respectively, after the phase comparator circuit 220 reaches the lock state. The phase synchronization circuit 200 is locked when the rising edge of a clock signal delayed by a differentiator circuit 221 or 231 is sufficiently close in time to the rising edge of a preempted clock signal that the inverter 228 or 238 of the differentiator circuit 221 or 231, respectively, stays at a high level while the output of the corresponding AND gate 225 or 235 changes to a high level. In this condition, the D flip-flop 224 or 234, respectively, is clocked and the trigger signal on lines TRIG_A or TRIG_B, respectively, stays low with the addition of no extra delay. Accordingly, accuracy of the phase comparator circuit 220 is the difference between the propagation delay of a signal pathway of a differentiator circuit which includes the inverter 228 or 238 and the resistor Ra or Rb and the propagation delay of AND gate 225 or 235 respectively. For a 5% tolerance resistor, a 20% tolerance of the input capacitance of FAST integrated circuits and a 20% tolerance of a voltage cross point (1.8 V), the accuracy of the phase comparator circuit 220 is typically about 0.7 ns, for example. The line delay resolution is typically about 1 ns so that the total accuracy (maximum error) is approximately 1.7 ns.

Figure 8:
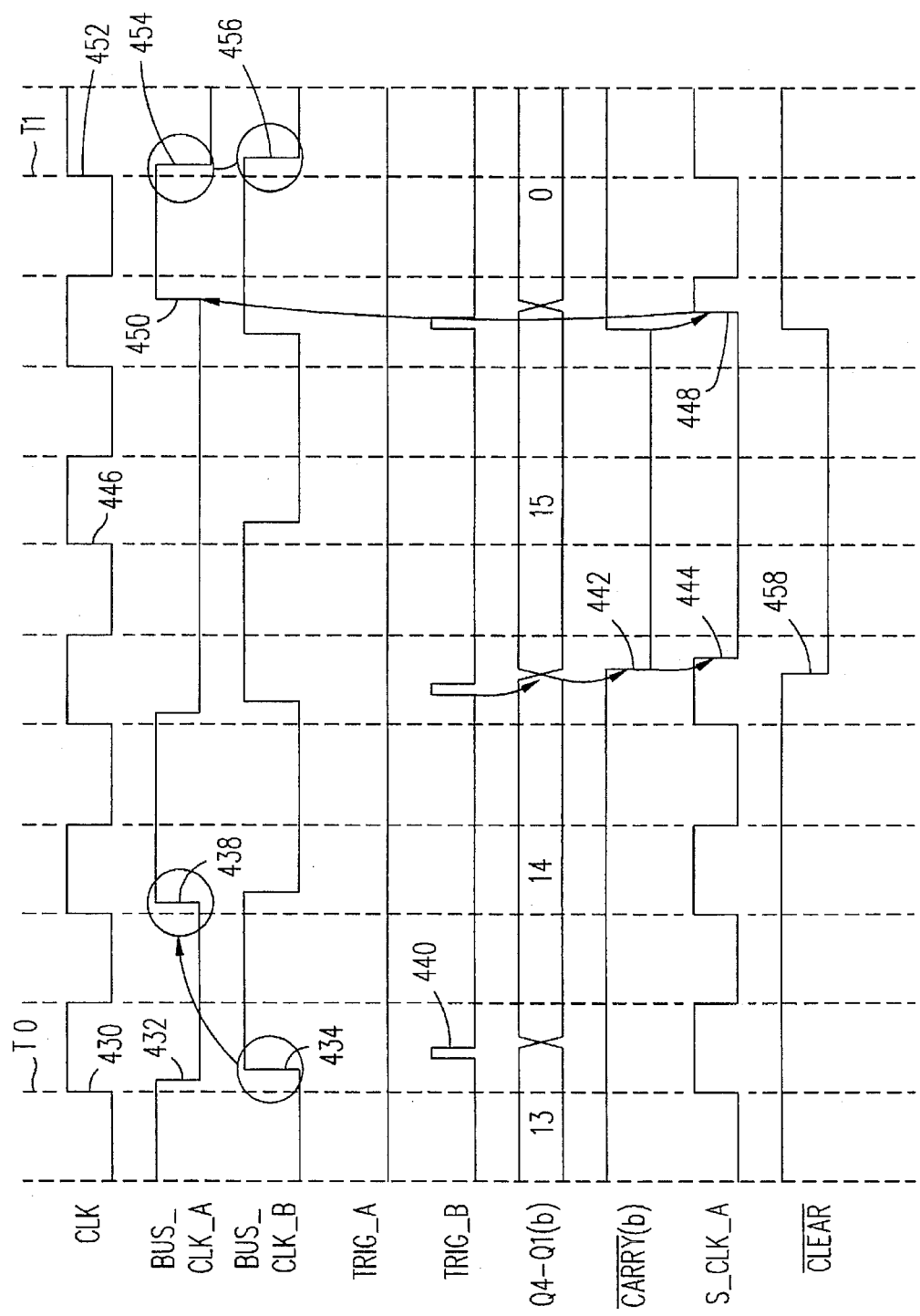
FIG. 8 depicts a timing diagram which illustrates the operation of the phase comparator circuit shown in FIG. 4 and the delay and counter circuit shown in FIG. 5 during "rough" phase synchronization.

Rough synchronization is utilized when the phase difference between the first and second bus clock signals is more then 180° degrees. The first step of rough synchronization is to force the bus clock signals to be "direction" synchronized so that that the rising edges of both first and second bus clock signals are forced to rise in synchrony with the rising edge of the clock signal on the CLK line. This first step is accomplished through operation of the delay and counter circuit 240 to delete one cycle of the clock signal on CLK line from one of the chips. Referring to FIG. 8 in conjunction with FIGS. 1 through 6, a timing diagram illustrates the combined operation of phase comparator circuit 220 and delay and counter circuit 240 during "rough" phase synchronization. At time T0, the frequency switch 280 generates a rising edge 430 of the clock signal on the CLK line. Shortly thereafter, the first bus clock signal on BUS_CLK_A line falls 432 and, a short time later, the second bus clock signal on BUS_CLK_B line rises 434. This condition exemplifies a phase difference which is greater than 180°. Because the rising edge 434 of the second bus clock signal on BUS_CLK_B line precedes the rising edge 438 of the first bus clock signal on BUS_CLK_A line, phase comparator circuit 220 clocks the second trigger signal on TRIG_B line (shown as pulse 440) while the first trigger signal on TRIG_A line does not change. FIG. 8 illustrates pulses 14, 15 and 16 of the second trigger signal on TRIG_B line. Second trigger signal pulses on TRIG_B line are applied to counter 254 of the second clock line delay and counter circuit 252. When counter 254 reaches a count of 16, its active-low carry signal on $\overline{CARRY}$(b) line is asserted low 442 and the second source clock signal on line S_CLK_A goes to a low level 444. The next rising edge 446 of the clock signal on the CLK line changes only the second bus signal on BUS_CLK_B line because the source clock signal on line S_CLK_A remains low. The next second trigger signal pulse on TRIG_B line is applied to counter 254, which deasserts the active-low carry signal on $\overline{CARRY}$(b) line. Since the clock signal on the CLK line is a high level signal at this time, the source clock signal on line S_CLK_A goes to a high level 448, thereby changing the second bus clock signal on BUS_CLK_A line to a high level 450.

In the next cycle of the phase synchronization circuit 200, starting at time T1, the frequency switch 280 generates a rising edge 452 of the clock signal on the CLK line and the falling-edges 454 and 456, respectively, of the first bus clock signal on BUS_CLK_A line and the second bus clock signal on BUS_CLK_B line occur simultaneously. This condition exemplifies a phase difference which is less than 180°.

The assertion 442 of the active-low carry signal on $\overline{\text{CARRY}}$(b) line, applied to AND gate 260 and AND gate 262 in delay and counter circuit 240 asserts the active low clear signal on $\overline{\text{CLEAR}}$ line 458. Active low clear signal on $\overline{\text{CLEAR}}$ line resets first and second D flip-flops 224 and 234 in the phase comparator circuit 220, starting the fine tuning phase of the synchronization process.

In the fine tuning phase, every rising edge of the preempted bus clock signal, either the first bus clock signal on BUS_CLK_A line or the second bus clock signal on BUS_CLK_B line, increments by one the corresponding counter, respectively counter 244 or 254, thereby adding a single unit delay (for example, 1 ns) to the corresponding clock. In this manner, the delay of the preempted source clock signal of line S_CLK_A or line S_CLK_B, is incremented.

Figure 9:
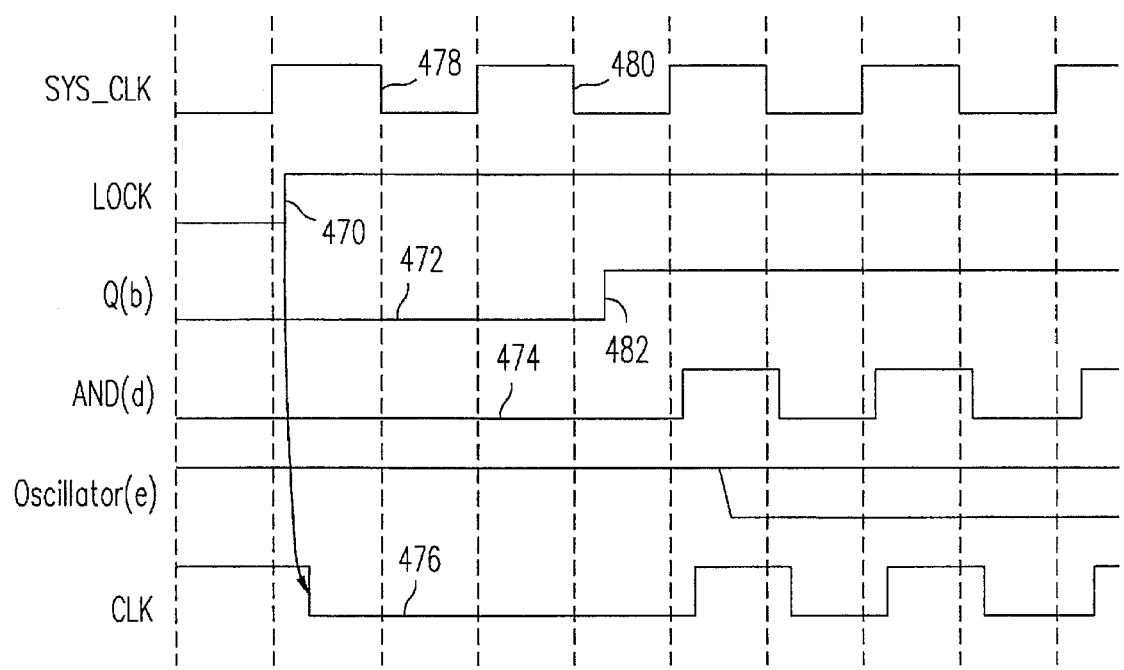
FIG. 9 illustrates a timing diagram of frequency switch timing during a switching operation.

Referring to FIG. 9, a timing diagram illustrates the timing of the frequency switch 280 switching operation. When the lock signal on LOCK line is asserted 470, the Q output terminal of second D flip-flop 286 furnishes a low level signal 472 so that AND gate 288 is inhibited and also generates a low level signal 474. The low signal 474 from AND gate 288 is applied to the first input terminal of buffer/line driver circuit 294 so that the clock signal on CLK line is switched low 476. Pullup resistor $R_{fs}$ insures that the clock signal on CLK line is not floated during the clock switching transition. After two falling edges 478 and 480 of the system clock signal on line SYS_CLK, the Q output terminal of second D flip-flop 286 switches to a high level signal 482, enabling AND gate 288 so that the system clock signal on SYS_CLK line now and hereafter drives the clock signal on CLK line. So long as the system clock frequency is lower than a predetermined maximum MAX frequency, the Q output terminal of second D flip-flop 286 switches to a high level signal as the system clock signal on line SYS_CLK is at a low level, eliminating the possibility of a timing glitch during oscillator switching.

The description of certain embodiments of this invention is intended to be illustrative and not limiting. Numerous other embodiments will be apparent to those skilled in the art, all of which are included within the broad scope of this invention.

What is claimed is:

1. A phase synchronization circuit for synchronizing timing of first and second integrated circuit chips comprising:

a phase comparator coupled to the first integrated circuit chips for receiving a first bus timing signal and coupled to the second integrated circuit chip for receiving a second bus timing signal, the phase comparator generating a signal indicative of a propagation delay of the first and second bus timing signals;

first and second adjustable delay lines coupled to the phase comparator for receiving the signal indicative of the propagation delay and coupled to a system clock line for receiving a system clock signal, the first and second adjustable delay lines respectively generating a first source clock signal for timing the first integrated circuit chip and a second source clock signal for timing the second integrated circuit chip, the first and second delay lines being responsive to the signal indicative of the propagation delay to increase a delay of a signal selected from the first and second source clock signals, the selected signal corresponding to a signal of the first and second bus clock signals having a smaller propagation delay; and a frequency switch circuit coupled to the first and second adjustable delay lines for switching to a low oscillating frequency when the propagation delay of the first integrated circuit chip and the propagation delay of the second integrated circuit chip are substantially matched.

2. A circuit according to claim 1 further comprising:

means for locking a delay of the first and second delay lines when the signal indicative of a propagation delay indicates that the propagation delay of the first and second integrated circuit chips are substantially matched.

3. A phase synchronization circuit comprising:

a phase comparator having a first input terminal coupled to a first bus clock line, a second input terminal coupled to a second bus clock line, a first output terminal coupled to a first trigger line and a second output terminal coupled to a second trigger line, the phase comparator further including a phase lock detect circuit having a control input terminal coupled to a clear line and a control output terminal coupled to a frequency switch;

a delay circuit having a first input terminal coupled to the first trigger line, a second input terminal coupled to the second trigger line, a first output terminal coupled to a first source clock line, a second output terminal coupled to a second source clock line, a clock input terminal coupled to a clock line, a control input terminal coupled to a reset line and a control output terminal coupled to the dear line; and said frequency switch having a clock signal input terminal coupled to a system oscillator, a clock signal output terminal coupled to the clock line, and a control input terminal coupled to said output terminal of said phase lock detect circuit.

4. A circuit according to claim 3 wherein the phase comparator comprises:

a first bus phase comparator circuit having an input terminal coupled to the first bus clock line and an output terminal coupled to the first trigger line, the first bus phase comparator circuit including:

a first differentiator including a first delay element and having an input terminal coupled to the first bus clock line and an output terminal; and a first D flip-flop having a clock terminal coupled to the output terminal of the first differentiator; and a second bus phase comparator circuit having an input terminal coupled to the second bus clock line and an output terminal coupled to the second trigger line, the second bus comparator circuit including:

a second differentiator including a second delay element and having an input terminal coupled to the second bus clock line and an output terminal;

a second D flip-flop having a clock terminal coupled to the output terminal of the second differentiator.

5. A circuit according to claim 4 wherein:

the first bus phase comparator circuit further includes:

a first AND gate having a first input terminal coupled to the output terminal of the first differentiator, a second input terminal coupled to the second delay element and an output terminal coupled to the clock terminal of the first D flip-flop; and a second AND gate having a first input terminal coupled to the output terminal of the first differentiator, a second input terminal coupled to a $\overline{Q}$ output terminal of the second D flip-flop and an output terminal coupled to the first trigger line; and the second bus phase comparator circuit further includes:

a third AND gate having a first input terminal coupled to the output terminal of the second differentiator, a second input terminal coupled to the first delay element and an output terminal coupled to the clock terminal of the second D tip-flop; and a fourth AND gate having a first input terminal coupled to the output terminal of the second differentiator, a second input terminal coupled to a $\overline{Q}$ output terminal of the first D flip-flop and an output terminal coupled to the second trigger line.

6. A circuit according to claim 3 wherein the phase lock detect circuit comprises:

a fifth AND gate having a first input terminal coupled to a Q output terminal of the first D flip-flop, a second input terminal coupled to a Q output terminal of the second D flip-flop and an output terminal coupled to the phase lock line.

7. A circuit according to claim 4 wherein:

the first delay element includes:

a resistor;

an inverter coupled in series with the resistor; and the first differentiator includes:

the first delay element having an input terminal coupled to the first bus clock line and an output terminal; and an AND gate having a first input terminal coupled to the first bus clock line, a second input terminal coupled to the output terminal of the first delay element.

8. A circuit according to claim 3 wherein the delay circuit comprises:

a first bus phase delay circuit including:

a first counter having an input terminal coupled to the first trigger line, a plurality of data output terminals, a carry output terminal and an input control terminal coupled to a reset line;

a first delay element having a plurality of delay control lines coupled to the data output terminals of the first counter, a clock input terminal coupled to the clock line and a clock output terminal; and a first AND gate having a first input terminal coupled to the first delay element clock output terminal, a second input terminal and an output terminal coupled to the first source clock line; and a second bus phase delay circuit including:

a second counter having an input terminal coupled to the second trigger line, a plurality of data output terminals, a carry output terminal coupled to the second input terminal of the first AND gate, and an input control terminal coupled to the reset line;

a second delay element having a plurality of delay control lines coupled to the data output terminals of the second counter, a clock input terminal coupled to the clock line and a clock output terminal; and a second AND gate having a first input terminal coupled to the second delay element clock output terminal, a second input terminal coupled to the carry output terminal of the first counter and an output terminal coupled to the second source clock line.

9. A circuit according to claim 8 wherein the delay circuit further comprises:

a third AND gate having a first input terminal coupled to the carry output terminal of the first counter, a second input terminal coupled to the carry output terminal of the second counter and an output terminal; and a fourth AND gate having a first input terminal coupled to the output terminal of the third AND gate, a second input terminal coupled to the reset line and an output terminal coupled to the clear line.

10. A circuit according to claim 3 wherein the frequency switch comprises:

a first inverter having an input terminal coupled to the system oscillator and an output terminal;

a first D flip-flop having a D input terminal coupled to said output terminal of said phase lock detect circuit, a clock input terminal coupled to the output terminal of the first inverter and a Q output terminal;

a second D flip-flop having a D input terminal coupled to the first D flip-flop Q output terminal, a clock input terminal coupled to the output terminal of the first inverter and a Q output terminal;

an AND gate having a first input terminal coupled to the system oscillator, a second input terminal coupled to the second D flip-flop Q output terminal and an output terminal;

an oscillator;

a second inverter having an input terminal coupled to said output terminal of said phase lock detect circuit and an output terminal;

a buffer having a first input terminal coupled to the output terminal of the AND gate, a first output terminal coupled to the clock line, a first control terminal coupled to the output terminal of the second inverter, a second input terminal coupled to the oscillator, a second output terminal coupled to the clock line, and a second control terminal coupled to said output terminal of said phase lock detect circuit.

11. A method of synchronizing timing signals of two integrated circuits comprising the steps of:

detecting a system reset signal:

enabling a low frequency temporary oscillator and disabling a system oscillator:

sensing a rising edge of a first bus clock signal and a second bus clock signal;

comparing a relative phase of the first and second bus clock signals to determine a leading bus clock signal;

identifying the leading bus clock signal to be a preempted bus clock signal;

monitoring the first and second bus clock signals to identify a plurality of preempted bus clock signals;

detecting rising edges of a plurality of preempted bus clock signals;

for each rising edge of the plurality of preempted bus clock signals, incrementing a delay of a source clock timing signal corresponding to the preempted bus clock signal;

comparing a relative phase of the first and second bus clock signals;

terminating further delaying of the source clock timing signal when the relative phase of the first and second bus clock signals match; and disabling the low frequency temporary oscillator and enabling the system oscillator.

12. A synchronizing method according to claim 11 wherein the source clock timing signal delay incrementing step further comprises the steps of:
   incrementing a counter in response to the preempted bus clock signal rising edge; and
   setting an adjustable delay line to the counter value.

13. A synchronizing method according to claim 11 wherein the step of incrementing the delay of the source clock timing signal comprises the steps of:
   counting a number of signal rising edges; and
   applying the count to a selectable delay line element.

14. A method of synchronizing timing signals of two integrated circuits comprising the steps of:
   detecting a system reset signal;
   enabling a low frequency temporary oscillator and disabling a system oscillator;
   sensing a rising edge of a first bus clock signal and a second bus clock signal;
   comparing a relative phase of the first and second bus clock signals to determine a leading bus clock signal;
   determining whether the relative phase of the first and second bus clock signals is greater than 180°;
   when the relative phase of the first and second bus clock signals is greater than 180°, rough synchronizing the first and second bus clock signals by eliminating one source clock cycle from one signal of the first and second bus clock signals;
   identifying the leading bus clock signal to be a preempted bus clock signal;
   monitoring the first and second bus clock signals to identify a plurality of preempted bus clock signals;
   detecting rising edges of the plurality of preempted bus clock signals;
   for each rising edge of the plurality of preempted bus clock signal rising edges, incrementing a delay of a source clock timing signal corresponding to the preempted bus clock signal;
   comparing a relative phase of the first and second bus clock signals;
   terminating further delaying of the source clock timing signal when the relative phase of the first and second bus clock signals match; and
   disabling the low frequency temporary oscillator and enabling the system oscillator.

15. A phase synchronization circuit comprising:
   means for detecting a system reset signal;
   means for enabling a low frequency temporary oscillator and disabling a system oscillator;
   means for sensing a rising edge of a first bus clock signal and a second bus clock signal;
   a phase comparator for comparing a relative phase of the first and second bus clock signals to determine a leading bus clock signal;
   means for identifying the leading bus clock signal to be a preempted bus clock signal;
   means for monitoring the first and second bus clock signals to identify a plurality of preempted bus clock signals;
   means for detecting rising edges of a plurality of preempted bus clock signals;
   means operative for the rising edges of the plurality of preempted bus clock signal rising edges for incrementing a delay of a source clock timing signal corresponding to the preempted bus clock signal;
   means for comparing a relative phase of the first and second bus clock signals;
   means for terminating further delaying of the source clock timing signal when the relative phase of the first and second bus clock signals match; and
   means for disabling the low frequency temporary oscillator and enabling the system oscillator.

16. An electronic circuit comprising:
   a first integrated circuit chip having a source clock input terminal coupled to a first source clock line and a bus clock output terminal coupled to a first bus clock line;
   a second integrated circuit chip having a source clock input terminal coupled to a second source clock line and a bus clock output terminal coupled to a second bus clock line;
   a phase comparator having a first input terminal coupled to the first bus clock line, a second input terminal coupled to the second bus clock line, a first output terminal coupled to a first trigger line and a second output terminal coupled to a second trigger line, the phase comparator generating trigger signals on the first and second trigger lines responsive to bus timing signals on the first and second bus clock lines indicative of a propagation delay in the first and second integrated circuit chips;
   a first adjustable delay line having an input terminal coupled to the first trigger line, an output terminal coupled to the first source clock line, and a clock input terminal coupled to a system clock line;
   a second adjustable delay line having an input terminal coupled to the second trigger line, an output terminal coupled to the second source clock line, and a clock input terminal coupled to the system clock line;
   the first and second adjustable delay lines generating source clock signals on the first and second source clock lines so that an additional delay is added to the source clock signals of a chip selected from the first and second integrated circuit chips, the selected chip having a smaller propagation delay; and
   a frequency switch having an input terminal coupled to the phase comparator and a clock signal output terminal coupled to the system clock line, the frequency switch locking a system clock signal generated on the system clock line responsive to a signal from the phase comparator indicative that the propagation delay in the first and second integrated circuit chips is substantially equal.

17. A circuit according to claim 16 further comprising:
   means coupled to the frequency switch for smoothly locking the system clock signal.

18. A circuit according to claim 17 wherein the phase comparator comprises:
   a first bus phase comparator circuit having an input terminal coupled to the first bus clock line and an output terminal coupled to the first trigger line, the first bus phase comparator circuit including:
      a first differentiator including a first delay element and having an input terminal coupled to the first bus clock line and an output terminal; and
      a first D flip-flop having a clock terminal coupled to the output terminal of the first differentiator; and
   a second bus phase comparator circuit having an input terminal coupled to the second bus clock line and an output terminal coupled to the second trigger line, the second bus comparator circuit including:
      a second differentiator including a second delay element and having an input terminal coupled to the second bus clock line and an output terminal;
   a second D flip-flop having a clock terminal coupled to the output terminal of the second differentiator.

19. A circuit according to claim 18 wherein:

the first bus phase comparator circuit further includes:

a first AND gate having a first input terminal coupled to the output terminal of the first differentiator, a second input terminal coupled to the second delay element and an output terminal coupled to the clock terminal of the first D flip-flop; and a second AND gate having a first input terminal coupled to the output terminal of the first differentiator, a second input terminal coupled to a $\overline{Q}$ output terminal of the second D flip-flop and an output terminal coupled to the first trigger line; and the second bus phase comparator circuit further includes:

a third AND gate having a first input terminal coupled to the output terminal of the second differentiator, a second input terminal coupled to the first delay element and an output terminal coupled to the clock terminal of the second D flip-flop; and a fourth AND gate having a first input terminal coupled to the output terminal of the second differentiator, a second input terminal coupled to a $\overline{Q}$ output terminal of the first D flip-flop and an output terminal coupled to the second trigger line.

20. A circuit according to claim 19 wherein:

the phase comparator further includes a phase lock detect circuit having a control input terminal coupled to a clear line and a control output terminal coupled to a phase lock line;

the first and second adjustable delay lines further include a control input terminal coupled to a reset line and a control output terminal coupled to the clear line; and the frequency switch further includes a control input terminal coupled to the phase lock line.

21. A circuit according to claim 20 wherein the phase lock detect circuit comprises:

a fifth AND gate having a first input terminal coupled to a Q output terminal of the first D flip-flop, a second input terminal coupled to a Q output terminal of the second D flip-flop and an output terminal coupled to the phase lock line.

22. A circuit according to claim 18 wherein:

the first delay element includes:
a resistor;
an inverter coupled in series with the resistor; and the first differentiator includes:
the first delay element having an input terminal coupled to the first bus clock line and an output terminal; and
an AND gate having a first input terminal coupled to the first bus clock line, a second input terminal coupled to the output terminal of the first delay element.

23. A circuit according to claim 16 wherein the first and second adjustable delay lines comprise:

a first bus phase delay circuit including:
a first counter having an input terminal coupled to the first trigger line, a plurality of data output terminals, a carry output terminal and an input control terminal coupled to a reset line;
a first delay element having a plurality of delay control lines coupled to the data output terminals of the first counter, a clock input terminal coupled to the clock line and a clock output terminal; and
a first AND gate having a first input terminal coupled to the first delay element clock output terminal, a second input terminal and an output terminal coupled to the first source clock line; and a second bus phase delay circuit including:
a second counter having an input terminal coupled to the second trigger line, a plurality of data output terminals, a carry output terminal coupled to the second input terminal of the first AND gate, and an input control terminal coupled to the reset line;
a second delay element having a plurality of delay control lines coupled to the data output terminals of the second counter, a clock input terminal coupled to the clock line and a clock output terminal; and
a second AND gate having a second input terminal coupled to the second delay element clock output terminal, a second input terminal coupled to the carry output terminal of the first counter, and an output terminal coupled to the second source clock line.

24. A circuit according to claim 23 wherein the first and second adjustable delay lines further comprise:

a third AND gate having a first input terminal coupled to the carry output terminal of the first counter, a second input terminal coupled to the carry output terminal of the second counter and an output terminal; and a fourth AND gate having a first input terminal coupled to the output terminal of the third AND gate, a second input terminal coupled to the reset line and an output terminal coupled to the clear line.

25. A circuit according to claim 16 wherein:

the phase comparator further includes a phase lock detect circuit having a control input terminal coupled to a clear line and a control output terminal coupled to a phase lock line;

the first and second adjustable delay lines further include a control input terminal coupled to a reset line and a control output terminal coupled to the clear line; and the frequency switch further includes a control input terminal coupled to the phase lock line.

26. A circuit according to claim 25 wherein the frequency switch comprises:

a first inverter having an input terminal coupled to the system oscillator and an output terminal;

a first D flip-flop having a D input terminal coupled to the phase lock line, a clock input terminal coupled to the output terminal of the first inverter and a Q output terminal;

a second D flip-flop having a D input terminal coupled to the first D flip-flop Q output terminal, a clock input terminal coupled to the output terminal of the first inverter and a Q output terminal;

an AND gate having a first input terminal coupled to the system oscillator, a second input terminal coupled to the second D flip-flop Q output terminal and an output terminal;

an oscillator;

a second inverter having an input terminal coupled to the phase lock line and an output terminal;

a buffer having a first input terminal coupled to the output terminal of the AND gate, a first output terminal coupled to the clock line, a first control terminal coupled to the phase lock line, a second input terminal coupled to the oscillator, a second output terminal coupled to the clock line, and a second control terminal coupled to the phase lock line.

* * * * *

UNITED STATES PATENT AND TRADEMARK OFFICE
CERTIFICATE OF CORRECTION

PATENT NO. : 5,631,591
DATED : May 20, 1997
INVENTOR(S) : Bar-Niv

It is certified that error appears in the above-indentified patent and that said Letters Patent is hereby corrected as shown below:

Col. 12, line 41,   delete "dear" and insert --clear--;

Col. 13, line 18,   delete "tip" and insert --flip--.

Signed and Sealed this

Twenty-eighth Day of October, 1997

*Attest:*

BRUCE LEHMAN

*Attesting Officer*          *Commissioner of Patents and Trademarks*